(12) United States Patent
Lim et al.

(10) Patent No.: US 7,982,433 B2
(45) Date of Patent: *Jul. 19, 2011

(54) METHOD OF ADJUSTING SOC FOR BATTERY AND BATTERY MANAGEMENT SYSTEM USING THE SAME

(75) Inventors: Gye-Jong Lim, Yongin-si (KR); Han-Seok Yun, Yongin-si (KR); Se-Wook Seo, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 1246 days.

This patent is subject to a terminal disclaimer.

(21) Appl. No.: 11/643,117

(22) Filed: Dec. 19, 2006

(65) Prior Publication Data

US 2007/0148532 A1    Jun. 28, 2007

(30) Foreign Application Priority Data

Dec. 22, 2005   (KR) .................. 10-2005-0127722

(51) Int. Cl.
*H02J 7/00*   (2006.01)
(52) U.S. Cl. .................... 320/132; 320/149; 324/428
(58) Field of Classification Search .................. 320/132, 320/149; 324/428
See application file for complete search history.

(56) References Cited

U.S. PATENT DOCUMENTS

| | | | |
|---|---|---|---|
| 4,193,026 A | 3/1980 | Finger et al. | |
| 6,285,163 B1 * | 9/2001 | Watanabe et al. | 320/132 |
| 6,314,346 B1 | 11/2001 | Kitajima et al. | |
| 6,359,419 B1 * | 3/2002 | Verbrugge et al. | 320/132 |
| 6,388,450 B2 * | 5/2002 | Richter et al. | 324/427 |
| 6,531,874 B2 * | 3/2003 | Mentgen et al. | 324/427 |
| 6,845,332 B2 * | 1/2005 | Teruo | 702/63 |
| 7,136,762 B2 * | 11/2006 | Ono | 702/63 |
| 7,202,632 B2 * | 4/2007 | Namba | 320/132 |
| 7,352,156 B2 * | 4/2008 | Ashizawa et al. | 320/132 |
| 7,649,338 B2 * | 1/2010 | Seo et al. | 320/132 |
| 7,728,555 B2 * | 6/2010 | Seo et al. | 320/132 |
| 2002/0030494 A1 | 3/2002 | Araki et al. | |

(Continued)

FOREIGN PATENT DOCUMENTS

CN    1311860 A    9/2001

(Continued)

OTHER PUBLICATIONS

European Search Report dated May 3, 2007 for corresponding European Patent Application No. 06126978.3-2216.

(Continued)

*Primary Examiner* — Edward Tso
*Assistant Examiner* — Manuel Hernandez
(74) *Attorney, Agent, or Firm* — Christie, Parker & Hale, LLP

(57) ABSTRACT

A state of charge (SOC) compensation method of a battery and a battery management system using the same. A charge/discharge current of the battery is used for calculating the SOC and an SOC voltage that is a value in an OCV table, a rheobasic voltage is calculated, an error in the SOC is measured by using a difference between the SOC voltage and the rheobasic voltage, and a range of the error is determined among multiple effective ranges. Subsequently, the SOC is compensated by using a compensation SOC set in correspondence with a range in which the error is included to thereby measure a more accurate SOC of the battery.

21 Claims, 6 Drawing Sheets

U.S. PATENT DOCUMENTS

2002/0113595 A1* 8/2002 Sakai et al. .................. 324/433
2003/0231005 A1 12/2003 Kohama et al.
2005/0269991 A1* 12/2005 Mitsui et al. ................. 320/132
2007/0145948 A1* 6/2007 Lim et al. ..................... 320/132

FOREIGN PATENT DOCUMENTS

| EP | 0 560 468 A1 | 9/1993 |
| EP | 1 081 499 A1 | 3/2001 |
| JP | 07-055903 | 3/1995 |

OTHER PUBLICATIONS

U.S. Notice of Allowance dated May 19, 2009, for cross-reference U.S. Appl. No. 11/643,218.
European Search Report dated Jun. 8, 2007, for European Patent application 06126330.7.
European Search Report dated Jun. 8, 2007, for European Patent application 06126452.9.

* cited by examiner

METHOD OF ADJUSTING SOC FOR BATTERY AND BATTERY MANAGEMENT SYSTEM USING THE SAME

CROSS-REFERENCE TO RELATED APPLICATION

This application claims priority to and the benefit of Korean Patent Application No. 10-2005-0127722, filed in the Korean Intellectual Property Office on Dec. 22, 2005, the entire content of which is incorporated herein by reference.

BACKGROUND OF THE INVENTION

1. Field of the Invention

The present invention relates to a battery management system. More particularly, the present invention relates to a method for correcting a state of charge (SOC) of a battery in a vehicle using electrical energy, and a battery management system using the same.

2. Description of the Related Art

Vehicles with an internal combustion engine using gasoline or diesel have caused serious air pollution. Accordingly, various undertakings for developing electric or hybrid vehicles have recently been made to reduce such air pollution.

An electric vehicle is run by using electrical energy output by a battery. Since the electric vehicle mainly uses a battery formed of one battery pack including a plurality of rechargeable/dischargeable secondary cells, it produces no emission gases and generates less noise.

A hybrid vehicle is a gasoline-electric hybrid vehicle that uses gasoline to power an internal-combustion engine and a battery to power an electric motor. Recently, hybrid vehicles using an internal-combustion engine and fuel cells and hybrid vehicles using a battery and fuel cells have been developed. The fuel cells directly obtain electrical energy by generating a chemical reaction while hydrogen and oxygen are continuously provided.

Such a vehicle using electrical energy drives a generator with residual power to charge the battery when an engine outputs high power, and drives a motor by using the electric power of the battery to overcome insufficiency of power when the engine outputs low power. In this case, the battery is discharged.

Since battery performance directly affects a vehicle using electrical energy, it is generally required that each battery cell has great performance. Also, it is generally required to provide a battery management system (BMS) for measuring voltage and current of the overall battery to efficiently manage charging/discharging operations of each battery cell.

Thus, a conventional BMS measures values of a voltage, a current, and a temperature of the battery to estimate a state of charge (SOC) through an operation, and controls the SOC to improve fuel consumption efficiency of the vehicle.

The SOC is controlled to provide a balance between motor driving for power assist during acceleration and energy recovery (e.g., regenerative braking) during deceleration. In general, for example, the battery over-discharging is controlled when the SOC is decreased to 50% and the battery over-charging is controlled when the SOC is increased to 70%, to maintain the range of the SOC of the battery within 50% to 70% to thereby keep the SOC close to the center of the control.

In order to accurately control the SOC, it is essential to accurately estimate SOC of the battery in the charging/discharging state.

Conventionally, there are two SOC estimation methods. One is to measure a charge current and a discharge current (charge current has a negative (−) sign and discharge current has a positive (+) sign), multiply the current value with charge efficiency, integrate the multiplication results for a predetermined time period to calculate integration capacity, and estimate an SOC based on the integration capacity. The other method is to measure and memorize a plurality of pair data of a discharge/charge current and a corresponding terminal voltage of a rechargeable battery, obtain a one-dimensional approximation line (voltage V-current I) from the pair data, and estimate an SOC based on the no-load voltage (open circuit voltage, OCV) that is a voltage (V section of V-I approximate line) calculated in correspondence to a current value of zero.

However, in the case of the SOC estimation method that uses the integration capacity, the charge efficiency applied to the integration of the current value depends on the SOC value, the current value, and the temperature, and therefore it is difficult to estimate the most adequate charge efficiency for each condition. Moreover, it is also difficult to calculate the amount of self discharge when the battery is in a non-use state.

Therefore, the conventional SOC measuring method that uses the integration capacity cannot measure an accurate SOC because an error between an exact value and an estimated value of the SOC increases as time elapses.

The above information disclosed in this Background section is only for enhancement of understanding of the background of the invention and therefore it may contain information that does not form the prior art that is already known in this country to a person of ordinary skill in the art.

SUMMARY OF THE INVENTION

In exemplary embodiments according to the present invention, a state of charge (SOC) compensation method for compensating an error of an SOC obtained by using an SOC estimation method, is provided.

In addition, exemplary embodiments of the present invention provide a battery management system for providing a more accurate SOC of a battery to an engine control unit of a vehicle by performing SOC compensation when an error of an SOC estimated by using an integration capacity exceeds a limited range.

An SOC compensation method of a battery management system according to an exemplary embodiment of the present invention compensates an SOC of a battery. The SOC compensation method includes: calculating the SOC of the battery and an SOC voltage corresponding to the SOC by using a charging/discharging current of the battery; calculating a rheobasic voltage of the battery by using the charging/discharging current of the battery, a voltage of the battery, and an internal resistance of the battery; calculating an integration error corresponding to a difference between the SOC voltage and the rheobasic voltage of the battery; determining in which effective range the integration error is included among multiple effective ranges; adding a compensation SOC to the SOC to compensate the SOC, so that the compensated SOC is included within an SOC range corresponding to the minimum effective range.

An SOC compensation method of a battery management system according to another exemplary embodiment of the present invention compensates an SOC of a battery. The SOC compensation method includes: calculating the SOC of the battery and an SOC voltage that corresponds to the SOC by using a charging/discharging current of the battery; measuring a charging/discharging voltage of the battery; calculating an integration error that corresponds to a difference between the SOC voltage and the charging/discharging voltage of the battery; determining in which effective range the integration error is included among multiple effective ranges; and adding a compensation SOC corresponding to the effective range in which the integration error is included among the multiple effective ranges to the SOC to make the compensated SOC included in an SOC range that corresponds to a minimum effective range among the multiple effective ranges.

A driving method according to another exemplary embodiment of the present invention is provided to drive a battery management system coupled to an engine control unit (ECU) of a vehicle that uses electrical energy. The driving method includes: measuring a charging/discharging current and a pack voltage of a battery; calculating an SOC of the battery and an SOC voltage that corresponds to the SOC by using the charging/discharging current of the battery; calculating a rheobasic voltage of the battery by using the charging/discharging current of the battery, a voltage of the battery, and an internal resistance of the battery; calculating an integration error that corresponds to a difference between the SOC voltage and the rheobasic voltage; determining in which effective range the calculated integration error is included among multiple effective ranges; adding a compensation SOC that corresponds to the effective range in which the integration error is included among the multiple effective ranges to the SOC to make a compensated SOC included in an SOC range that corresponds to a minimum effective range among the multiple effective ranges; and outputting the compensated SOC as a current SOC of the battery to the ECU.

In said determining in which effective range the integration error is included, the integration error may be compared with at least one of an upper threshold value or a lower threshold value of the minimum effective range among the multiple effective ranges, the effective range in which the integration error is included may be determined by repeating the comparison between the integration error and at least one of an upper threshold value or a lower threshold value of a next smallest effective range among the multiple effective ranges when the integration error exceeds the upper threshold value or the lower threshold value of the minimum effective range among the multiple effective ranges.

In said adding the compensation SOC, when the integration error exceeds an upper threshold value of a specific effective range, the compensation SOC may be subtracted from the SOC, and when the integration error exceeds a lower threshold value of the specific effective range, the compensation SOC may be added to the SOC.

The upper threshold value has a positive value and the lower threshold value has a negative value, and an absolute value of the upper threshold value and an absolute value of the lower threshold value are the same.

In said calculating the SOC, an integration current may be measured by employing a current integration method that uses a charge/discharge current of the battery, the SOC corresponding to the integration current may be calculated, and the SOC voltage may be calculated by applying the SOC to an open circuit voltage (OCV) table.

A driving method according to another exemplary embodiment of the present invention is provided to drive a battery management system coupled to an engine control unit (ECU) of a vehicle that uses electrical energy. The driving method includes: measuring a charging/discharging current and a pack voltage of a battery; calculating a state of charge (SOC) of the battery and an SOC voltage that corresponds to the SOC by using the charging/discharging current of the battery; measuring a charging/discharging voltage of the battery; calculating an integration error that corresponds to a difference between the SOC voltage and the charging/discharging voltage; determining in which effective range the calculated integration error is included among multiple effective ranges; adding a compensation SOC corresponding to the effective range in which the integration error is included among the multiple effective ranges to the SOC to make the compensated SOC included in an SOC range that corresponds to a minimum effective range among the multiple effective ranges; and outputting the compensated SOC as a current SOC of the battery to the ECU.

A battery management system according to another exemplary embodiment of the present invention is provided to manage a battery. The battery management system outputs an SOC of the battery to an engine control unit (ECU) of a vehicle that uses electrical energy. The battery management system includes an integration SOC calculator, an integration voltage calculator, a rheobasic voltage calculator, an effective range determiner, an SOC compensator, and an SOC output unit. The integration SOC calculator calculates the SOC by using a charging/discharging current of the battery. The integration voltage calculator calculates an integration voltage that corresponds to the SOC. The rheobasic voltage calculator calculates a rheobasic voltage of the battery by using a pack voltage of the battery, the charging/discharging current of the battery, and an internal resistance of the battery. The effective range determiner calculates an integration error by using the integration voltage and the rheobasic voltage, determines in which effective range the calculated integration error is included among multiple effective ranges, and outputs a specific effective range excess signal or a specific effective range below signal according to a result of the determination. The SOC compensator compensates the integration error to be included within a minimum effective range among the multiple effective ranges by adding a compensation SOC to the SOC when the output of the effective range determiner indicates that the integration error is not included in the specific effective range, the compensation SOC being set in accordance with the output of the effective range determiner. The SOC output unit outputs an output of the SOC compensator as a current SOC of the battery to the ECU.

A battery management system according to another exemplary embodiment of the present invention is provided to manage a battery. The battery management system outputs an SOC of the battery to an engine control unit (ECU) of a vehicle that uses electrical energy. The battery management system includes an integration SOC calculator, an integration voltage calculator, an effective range determiner, an SOC compensator, and an SOC output unit. The integration SOC calculator calculates the SOC by using a charging/discharging current of the battery. The integration voltage calculator calculates an integration voltage that corresponds to the SOC. The effective range determiner calculates an integration error by using the integration voltage and a charging/discharging voltage of the battery, determines in which effective range the calculated integration error is included among multiple effective ranges, and outputs a specific effective range excess signal or a specific effective range below signal according to a result of the determination. The SOC compensator compensates the integration error to be included within a minimum effective range among the multiple effective ranges by adding a compensation SOC to the SOC when the output of the effective range determiner indicates that the integration error is not included in the specific effective range, the compensation SOC being set in accordance with an output of the effective range determiner. The SOC output unit outputs an output of the SOC compensator as a current SOC of the battery to the ECU.

The effective range determiner may be adapted to compare the integration error and at least one of an upper threshold value or a lower threshold value of the minimum effective range among the multiple effective ranges, and to determine in which effective range the integration error is included by repeating the comparison between the integration error and at least one of an upper threshold value or a lower threshold value of a next smallest effective range among the multiple effective ranges when the integration error exceeds the upper threshold value or the lower threshold value of the minimum effective range among the multiple effective ranges.

The SOC compensator may be adapted to subtract the compensation SOC from the SOC when the integration error exceeds an upper threshold value of a specific effective range and to add the compensation SOC to the SOC when the integration error exceeds a lower threshold value of the specific effective range.

The integration voltage calculator may be adapted to calculate an integration voltage that corresponds to the SOC by applying the SOC to an SOC to open circuit voltage (OCV) table.

DETAILED DESCRIPTION

Figure 1:
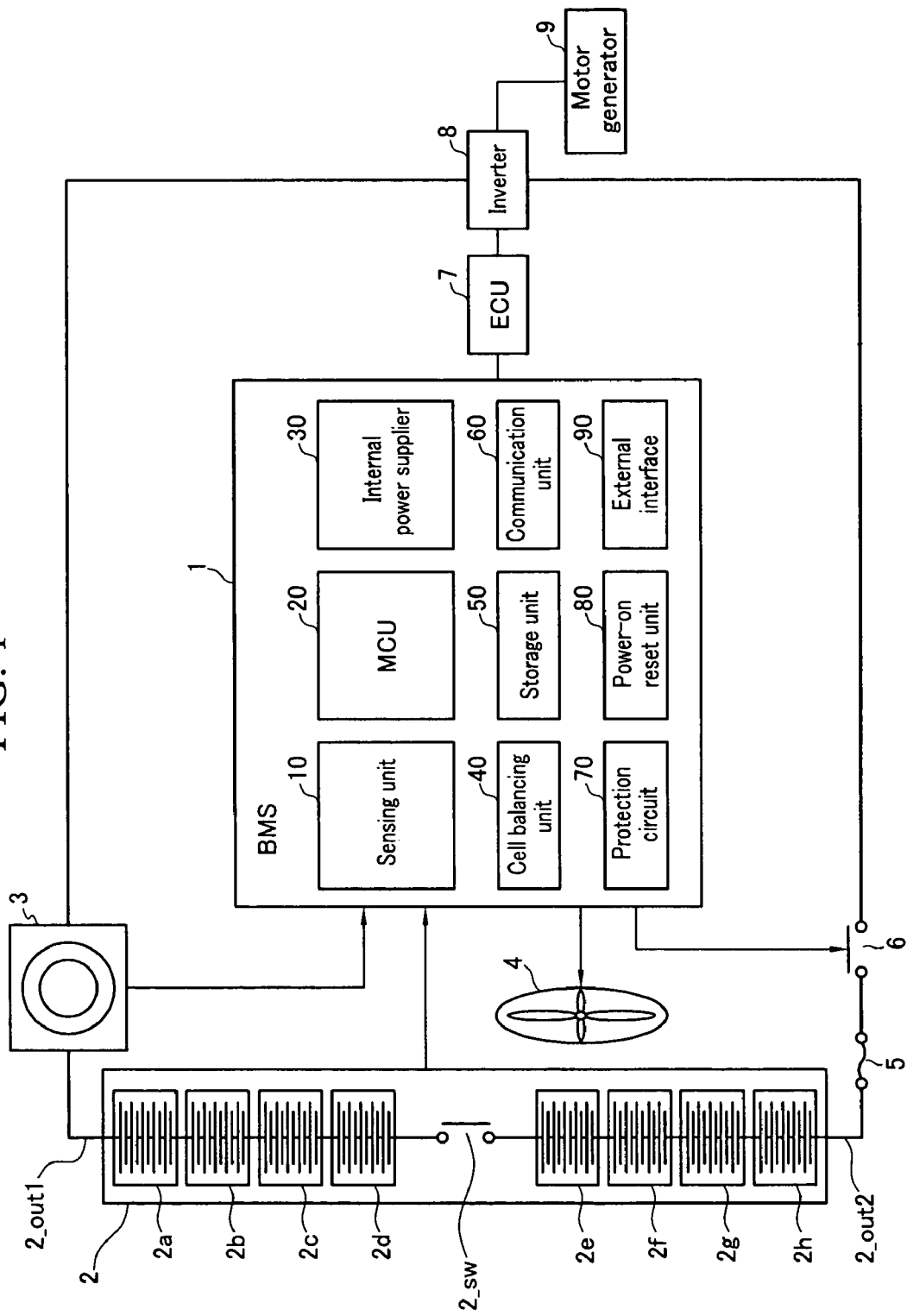
FIG. 1 is a schematic diagram of a vehicle system that uses electrical energy according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims which follow, when it is described that an element is coupled to another element, the element may be directly coupled to the other element or electrically coupled to the other element through a third element. In addition, throughout this specification and the claims which follow, unless explicitly described to the contrary, the word"comprise/include" and variations such as "comprises/includes" or"comprising/including" will be understood to imply the inclusion of stated elements but not the exclusion of any other elements.

A method for correcting a state of charge (SOC) of a battery and a battery management system (BMS) using the method will now be described in more detail with reference to the accompanying drawings.

FIG. 1 schematically shows a vehicle system that uses electrical energy according to an exemplary embodiment of the present invention.

As shown in FIG. 1, the vehicle system includes a BMS 1, a battery 2, a current sensing unit 3, a cooling fan 4, a fuse 5, a main switch 6, an engine control unit (ECU) 7, an inverter 8, and a motor generator 9.

The battery 2 includes a plurality of sub-packs formed of a plurality of battery cells 2a to 2h coupled in series with each other, output terminals 2_out1 and 2_out2, and a safety switch 2_sw provided between the sub-pack 2d and the sub-pack 2e. Herein, eight sub-packs 2a to 2h are exemplarily illustrated, and each sub-pack is formed by grouping a plurality of battery cells in one group, but this is not restrictive. In addition, the safety switch 2_sw is provided between the sub-pack 2d and the sub-pack 2e, and is manually turned on or turned off to guarantee the safety of a worker when performing operations on the battery or replacing the battery. In a first exemplary embodiment, the safety switch 2_sw is provided between the sub-pack 2d and the sub-pack 2e, but this is not limited thereto. The output terminals 2_out1 and 2_out2 are coupled to the inverter 8.

The current sensing unit 3 measures the amount of output current of the battery 2 and outputs the measured amount to the sensing unit 10 of the BMS 1. In more detail, the current sensing unit 3 may be provided as a hall current transformer (Hall CT) using a hall element to measure the amount of output current, and to output an analog current signal corresponding to the measured amount of the output current.

The cooling fan 4 cools down heat generated by charging/discharging the battery 2 in response to a control signal from the BMS 1, and prevents deterioration and reduction of charge/discharge efficiency of the battery 2 that are caused by an increase of temperature.

The fuse 5 prevents an over-current, which may be caused by a disconnection or a short circuit of the battery 2 from being transmitted to the battery 2. That is, when an over-current is generated, the fuse 5 is disconnected so as to interrupt the current from overflowing.

The main switch 6 turns on/off the battery 2 in response to the control signal from the BMS 1 or a control signal from the ECU 7 when an unusual phenomenon, such as, for example, an over-voltage, an over-current, and/or a high temperature, occurs.

The BMS 1 includes a sensing unit 10, a main control unit (MCU) 20, an internal power supplier 30, a cell balancing unit 40, a storage unit 50, a communication unit 60, a protection circuit unit 70, a power-on reset unit 80, and an external interface 90.

The sensing unit 10 measures an overall battery pack current, an overall battery pack voltage, each battery cell voltage, each battery cell temperature, and an ambient temperature, and transmits the measured voltages and temperatures to the MCU 20.

The MCU 20 estimates a state of charge (SOC) and a state of health (SOH) of the battery 2 based on the overall battery pack current, the overall battery pack voltage, each battery cell voltage, each battery cell temperature, and the ambient temperature, generates information on a state of the battery 2, and transmits the information to the ECU 7 of the vehicle system. Accordingly, the ECU 7 of the vehicle system charges or discharges the battery 2 based on the SOC and the SOH delivered from the MCU 20.

The internal power supplier 30 supplies power to the BMS 1 by using a backup battery. The cell balancing unit 40 balances the charging state of each cell. That is, cells that are sufficiently charged are discharged, and cells that are relatively less charged are further charged.

The storage unit 50 stores the current SOC data or current SOH state data when the power source of the BMS 1 is turned off. Here, an electrically erasable programmable read-only memory (EEPROM) may be used as the storage unit 50. The communication unit 60 communicates with the ECU 7 of the vehicle system.

The protection circuit 70 protects the battery 2 from external impact, over-flowed current, or low voltages by using firmware. The power-on reset unit 80 resets the overall system when the power source of the BMS 1 is turned on. The external interface 90 couples BMS auxiliary devices, including the cooling fan 4 and the main switch 6, to the MCU 20. In the present exemplary embodiment, the cooling fan 4 and the main switch 6 are illustrated as the auxiliary devices of the BMS 1, but this is not restrictive.

The ECU 7 determines the amount of torque based on vehicle information, such as an accelerator, a break, or a speed of the vehicle, etc., and controls an output of the motor generator 9 in accordance with the torque information. That is, the ECU 7 controls the output of the motor generator 9 in accordance with the torque information by controlling switching of the inverter 8. Also, the ECU 7 receives the SOC of the battery 2 from the MCU 20 through the communication unit 60 of the BMS 1 and controls the SOC of the battery 2 to reach a target value (e.g., 55%).

For example, when the SOC level transmitted from the MCU 20 is lower than 55%, the ECU 7 controls a switch of the inverter 8 so as to output power toward the battery 2, so as to charge the battery 2. In this case, the battery pack current I is a negative (−) value. When the SOC level is greater than 55%, the ECU 7 controls the switch of the inverter 8 to output the power toward the motor generator 9 and discharge the battery 2. In this case, the battery pack current I is a positive (+) value.

This way, the inverter 8 controls the battery 2 to be charged or discharged in response to the control signal of the ECU 7.

The motor generator 9 uses the electrical energy of the battery 2 to drive the vehicle based on the torque information transmitted from the ECU 7.

Accordingly, the ECU 7 charges and discharges the battery 2 based on the SOC level to prevent the battery 2 from being over-charged or over-discharged, and therefore the battery 2 can be efficiently used for a longer time. However, since it is difficult to measure an accurate SOC level of the battery 2 when the battery 2 is mounted on a vehicle, the BMS 1 must precisely measure the SOC level by using the battery pack current and battery pack voltage that are sensed by the sensing unit 10 and deliver the measured SOC to the ECU 7.

Figure 2:
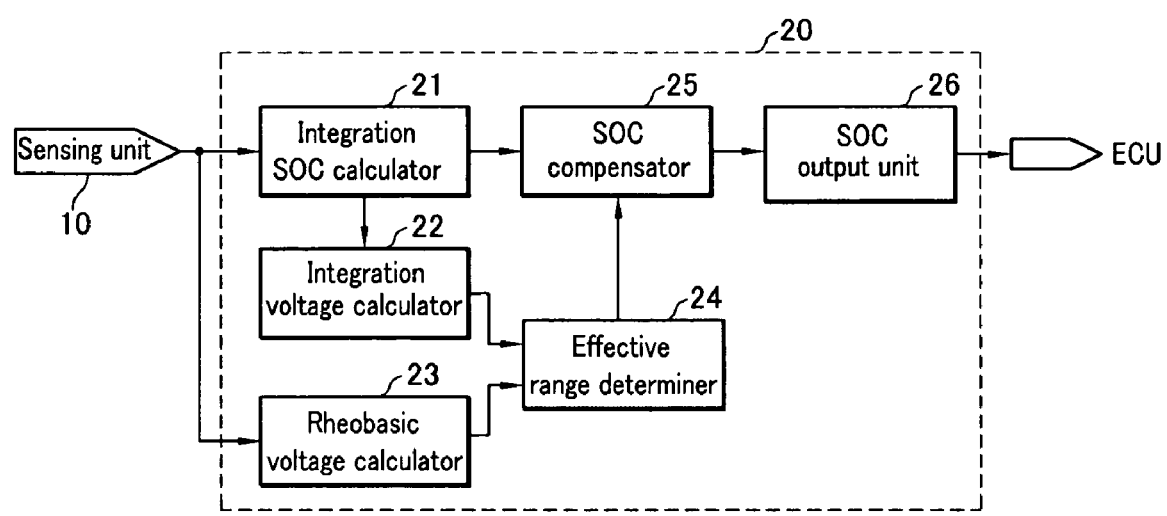
FIG. 2 is a schematic diagram of a main control unit (MCU) of a battery management system (BMS) according to an exemplary embodiment of the present invention.

The MCU 20 for outputting the SOC level according to the exemplary embodiment of the present invention will now be described in more detail with reference to FIG. 2. FIG. 2 schematically shows the MCU 20 of the BMS 1 according to the exemplary embodiment of the present invention.

As shown in FIG. 2, the MCU 20 includes an integration SOC calculator 21, an integration voltage calculator 22, a rheobasic voltage calculator 23, an effective range determiner 24, an SOC compensator 25, and an SOC output unit 26.

The integration SOC calculator 21 calculates an SOC of the battery 2 by applying an SOC estimation method that uses integration capacity. The SOC estimation method is known to those skilled in the art. For example, the integration SOC calculator 21 measures and determines a charging/discharging current level provided from the sensing unit 10. In this case, the charge current has a negative (−) value when the battery 2 is being charged, and has a positive (+) value when the battery 2 is being discharged. After determining the current value, the integration SOC calculator 21 multiplies the current value with charge efficiency, integrates a value obtained from the multiplication for a time period (e.g., a predetermined time period), calculates the integration capacity, and calculates the SOC level based on the integration capacity.

That is, the integration SOC calculator 21 adds the current value to a previous integration SOC level, which is given as (current integration SOC=previous integration SOC+(I*t)). Herein, I denotes a measured current and t denotes a time from a previous SOC integration to a current SOC integration (typically, t represents one cycle time of a control loop).

The integration voltage calculator 22 calculates the corresponding integration SOC voltage (hereinafter, referred to as an "integration voltage Vsoc") from the integration SOC transmitted from the integration SOC calculator 21 by using an SOC to battery voltage value (i.e., open circuit voltage, OCV) table.

The rheobasic voltage calculator 23 calculates a current rheobasic voltage of the battery 2 by using the overall battery pack current, the overall battery pack voltage, the cell voltage, the cell temperature, and the ambient temperature, which are provided from the sensing unit 10.

The rheobasic voltage Vo is obtained by adding a voltage drop due to an internal battery resistance R to a battery output voltage. Accordingly, the rheobasic voltage calculator 23 calculates the rheobasic voltage Vo from an output of the sensing unit 10 by using an equation of (rheobasic voltage Vo=battery voltage V+RI).

The effective range determiner 24 determines whether the integration SOC output from the integration SOC calculator 21 has an error component, and determines whether the error component exists within the effective range. Thus, the effective range determiner 24 receives an integration voltage Vsoc output from the integration voltage calculator 22 and the rheobasic voltage Vo output from the rheobasic voltage calculator 23, calculates an error component (hereinafter, referred to as an "integration error") from a difference between the integration voltage Vsoc and the rheobasic voltage Vo that are received at the same time, and compares the calculated integration error and an effective range (e.g., a predetermined effective range).

An integration error ΔVo can be calculated by Equation 1.

$$\Delta V_o = V_{SOC} - V_o \qquad \text{Equation 1}$$

Accordingly, when the integration voltage Vsoc is greater than the rheobasic voltage Vo, the integration error ΔVo has a positive value, and when the integration voltage Vsoc is less than the OCV voltage Vo, the integration error ΔVo has a negative value.

The effective range determiner 24 has multiple effective ranges. The multiple effective ranges are formed of a plurality of effective ranges in the largest valid range, and the width of each valid range sequentially decreases. For example, assuming that a value A is a reference value, the multiple effective ranges according to the exemplary embodiment of the present invention satisfy K<K1<K2<K3<A<P3<P2<P1<P, and K and P, K1 and P1, K2 and P2, and K3 and P3 respectively form effective ranges. Herein, P denotes a positive threshold value, and K denotes a negative threshold value.

For better understanding, assume that the multiple effective ranges of the effective range determiner 24 are double effective ranges that satisfy, for example, −a<−b<ΔVo<b<a. Hereinafter, a represents a first maximum threshold value, b represents a second maximum threshold value, −a represents a first minimum threshold value, and −b represents a second minimum threshold value.

The effective range determiner 24 determines 1) whether the integration error $\Delta Vo$ is within the effective range, 2) whether the integration voltage Vsoc is greater than the rheobasic voltage Vo so that the integration error $\Delta Vo$ exceeds the first or second maximum threshold value a or b, or 3) whether the integration voltage Vsoc is less than the rheobasic voltage Vo so that the integration error $\Delta Vo$ is less than the first or second minimum threshold value −a or −b, and provides an output to the SOC compensator 25.

The SOC compensator 25 determines whether to compensate the integration SOC that has been received from the integration SOC calculator 21 according to the output of the effective range determiner 24. When the integration SOC is determined to be compensated, the SOC compensator 25 adds or subtracts a compensation SOC set in correspondence with the integration error to the integration SOC. Through such SOC compensation, the integration SOC is maintained within an SOC range that corresponds to the minimum effective range among the multiple effective ranges (see FIG. 3).

For example, except for the case where the integration error $\Delta Vo$ is within the valid range, the SOC compensator 25 subtracts a first compensation SOC $\alpha$ from the integration SOC when the integration error $\Delta Vo$ is not within the effective range and exceeds the first maximum threshold value a, and subtracts a second compensation SOC $\beta$ from the integration SOC when the integration error $\Delta Vo$ is not within the effective range and exceeds the second maximum threshold value b. In addition, the SOC compensator 25 adds a third compensation SOC $\alpha$ to the integration SOC when the integration error $\Delta Vo$ exceeds the first minimum threshold value −a, and adds a fourth compensation SOC $\beta$ to the integration SOC when the integration error $\Delta Vo$ exceeds the second minimum threshold value −b. In this embodiment, the first compensation SOC equals the third compensation SOC, and the second compensation SOC equals the fourth compensation SOC, and the first compensation SOC and the third compensation SOC are different from each other and the second compensation SOC and the fourth compensation are different from each other.

The SOC output unit 26 receives the SOC output from the SOC compensator 25 and outputs the received SOC to the ECU 7 for an initial SOC reset.

Figure 3:
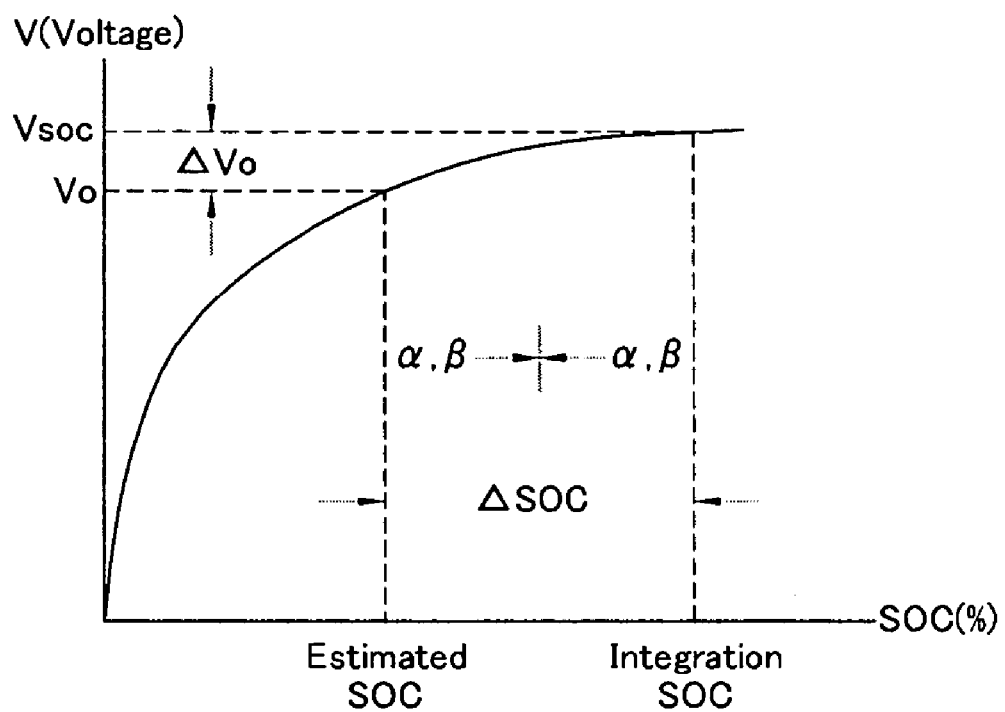
FIG. 3 is a graph showing a relationship between a state of charge (SOC) and a rheobasic voltage corresponding to an SOC to rheobasic table.

FIG. 3 is a graph showing a relationship between the SOC and the OCV corresponding to the SOC to OCV table. As shown in FIG. 3, by using an SOC to a rheobasic voltage Vo line (or a lookup table), when the integration voltage Vsoc or the rheobasic voltage Vo are provided, and when the integration SOC or the estimated SOC are provided, the voltage Vsoc and the rheobasic voltage Vo can be obtained.

Therefore, when a difference between the integration voltage Vsoc and the rheobasic voltage Vo is provided, a difference $\Delta SOC$ between the integration SOC and the estimated SOC (close to an actual value) can be obtained, and when the difference $\Delta SOC$ is greater than a predetermined level, the integration SOC can be compensated to be closer to the estimated SOC. The SOC compensation that compensates the SOC close to the estimated SOC maintains the difference $\Delta SOC$ to be within the predetermined level.

Figure 4:
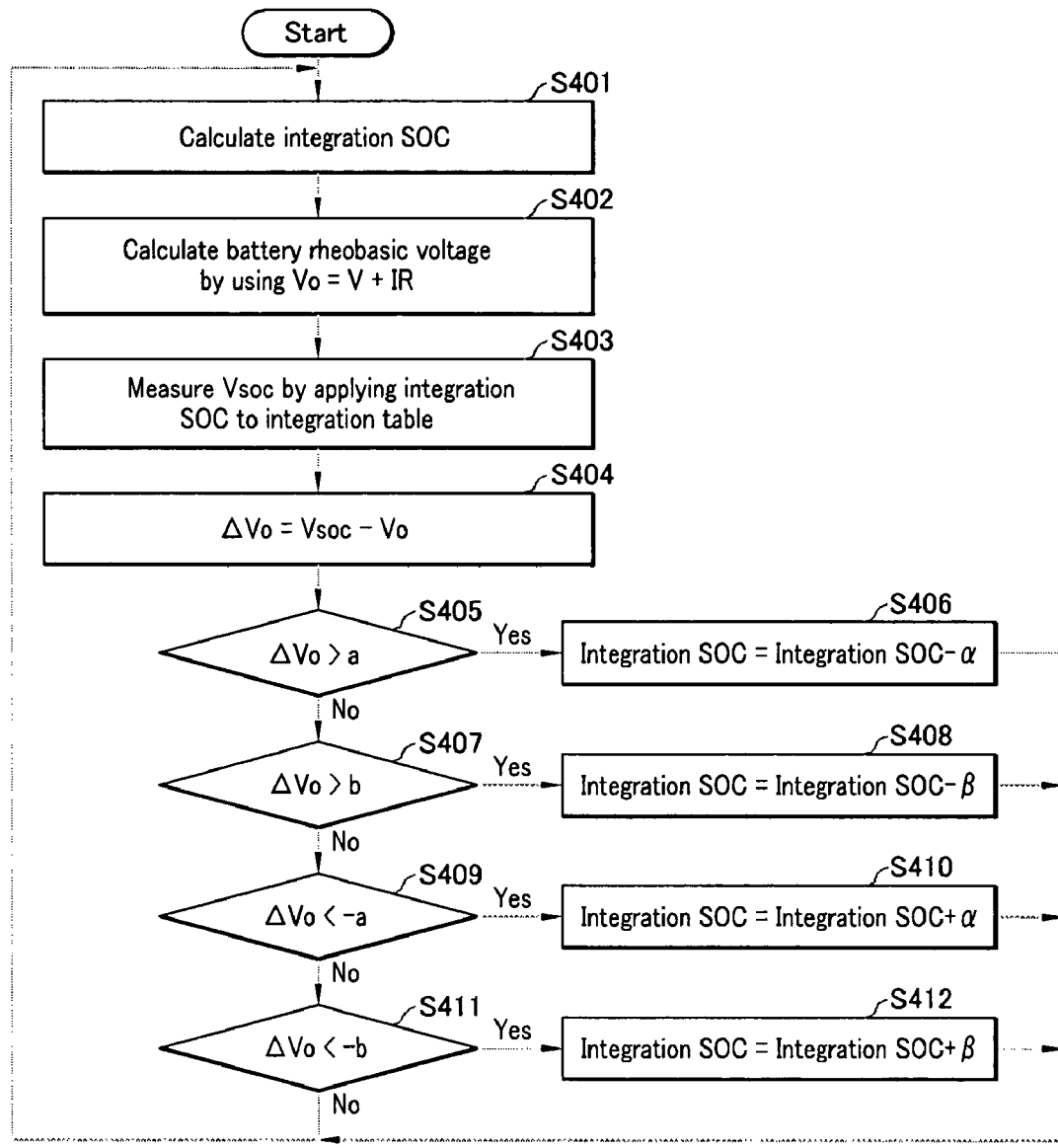
FIG. 4 shows a flowchart that sequentially illustrates a method for correcting SOC of a battery according to an exemplary embodiment of the present invention.

An SOC compensation method according to an exemplary embodiment of the present invention will now be described in more detail with reference to FIG. 4. FIG. 4 sequentially shows a process for SOC compensation of the battery according to an exemplary embodiment of the present invention.

The integration SOC calculator 21 integrates the current values received from the sensing unit 10 during a period of time (e.g., a predetermined period of time) to determine the integration current, calculates the integration SOC by using the integration current, and provides the calculated integration SOC to the integration voltage calculator 22 and the SOC compensator 25, in step S401.

At the same time, the rheobasic calculator 23 receives the overall battery pack current, the overall battery pack voltage, each battery cell voltage, and each battery cell temperature, and the ambient temperature from the sensing unit 10, and calculates the rheobasic voltage in the state in which the current I equals a zero state in step S402.

The rheobasic calculator 23 provides the calculated rheobasic voltage Vo to the effective range determiner 24.

After receiving the integration SOC, the integration voltage calculator 22 applies the integration SOC to the OCV table to determine the integration voltage Vsoc, and provides the calculated integration voltage Vsoc to the effective range determiner 24, in step S403.

The effective range determiner 24 subtracts the rheobasic voltage Vo from the integration voltage Vsoc input at the same time, and calculates the integration error $\Delta Vo$, in step S404.

Subsequently, the effective range determiner 24 determines whether the integration error $\Delta Vo$ is greater than the first maximum threshold value a in order to compare the integration error $\Delta Vo$ and the effective range, in step S405.

When a result of the determination of step S405 shows that the integration error $\Delta Vo$ is greater than the first maximum threshold value a, the effective range determiner 24 outputs a first positive excess signal to the SOC compensator 25. When the first positive excess signal is output, the SOC compensator 25 subtracts the first positive compensation SOC $\alpha$ from the integration SOC that has been currently received from the integration SOC calculator 21 (i.e., integration SOC—first positive compensation SOC $\alpha$), and provides a compensation result SOC to the SOC output unit 26, in step S406. Here, the first positive compensation SOC $\alpha$ is set corresponding to the first positive excess signal.

When the result of the determination in the step S405 shows that the integration error $\Delta Vo$ is less than the first maximum threshold value a, the effective range determiner 24 compares the integration error $\Delta Vo$ and the second maximum threshold value b so as to determine whether the integration error $\Delta Vo$ is greater than the second maximum threshold value b, in step S407.

When the determination of step S407 shows that the integration error $\Delta Vo$ is greater than the second maximum threshold value a, the effective range determiner 24 outputs a second positive excess signal to the SOC compensator 25.

When the second positive excess signal is output, the SOC compensator 25 subtracts a second positive compensation SOC $\beta$ from the integration SOC (i.e., integration SOC—second positive compensation SOC $\beta$) and provides a compensation result SOC to the SOC output unit 26 in step S408. Here, the second positive correction SOC $\beta$ is set corresponding to the second positive excess signal.

When the determination of step S407 shows that the integration error $\Delta Vo$ is less than the second maximum threshold value b, the effective range determiner 24 compares the integration error $\Delta Vo$ and the first minimum threshold value −a so as to determine whether the integration error $\Delta Vo$ is less than the first minimum threshold value −a in step S409.

When the determination of step S409 shows that the integration $\Delta Vo$ is less than the minimum threshold value −a, the effective range determiner 24 outputs a first negative excess signal. When the first negative excess signal is output, the SOC compensator 25 adds a first negative correction SOC $\alpha$ to an integration SOC that has been currently received from the integration SOC calculator 21 (i.e., integration SOC+first negative correction SOC α), and provides a compensation result SOC to the SOC output unit 26 in step S410. Here, the first negative correction SOC α is set corresponding to the first negative excess signal.

When the determination of the step S409 shows that the integration error ΔVo is greater than the first minimum threshold value −a, the effective range determiner 24 compares the integration error ΔVo and the second minimum threshold value −b so as to determine whether the integration error ΔVo is less than the second minimum threshold value −b in step S411.

When the determination of step S411 shows that the integration error ΔVo is less than the second minimum threshold value −b, the effective range determiner 24 outputs a second negative excess signal to the SOC compensator 25. When the second negative excess signal is output, the SOC compensator 25 adds a second negative compensation SOC β to the integration SOC that has been currently received from the integration SOC calculator 21 (i.e., integration SOC+second negative compensation SOC β) and provides a compensation result SOC to the output unit 26 in step S412. Herein, the second negative compensation SOC β is set corresponding to the second negative excess signal.

In addition, when the integration error ΔVo is less than the second maximum threshold value b and greater than the second minimum threshold value −b, the effective range determiner 24 determines the integration error ΔVo as the normal state and outputs a normal signal to the SOC compensator 25. The SOC compensator 25 provides the integration SOC transmitted from the integration SOC calculator 21 to the SOC output unit 26.

Such operations of the effective range determiner 24 and the SOC compensator 25 will be described with reference to FIG. 3. When a range of the integration error ΔVo of FIG. 3 is one of the multiple effective ranges (or multiple valid ranges) and the integration SOC leaves an effective SOC range ΔSOC corresponding to the integration error ΔVo, the compensation SOC β is added or subtracted so that the integration SOC may be maintained within the range ΔSOC.

A SOC compensation method of a battery according to another exemplary of the present invention will now be described.

The SOC compensation method according to the second exemplary embodiment is similar to the first exemplary embodiment of the present invention except that an integration SOC is compensated by using a charge/discharge voltage V of a battery rather than using a rheobasic voltage Vo.

Figure 5:
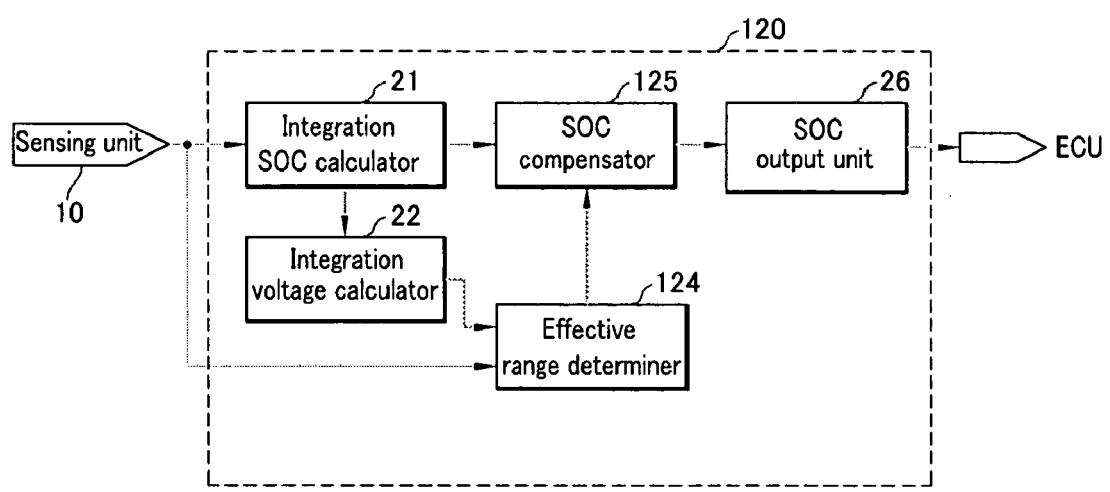
FIG. 5 schematically shows an MCU of a BMS according to another exemplary embodiment of the present invention.
Figure 6:
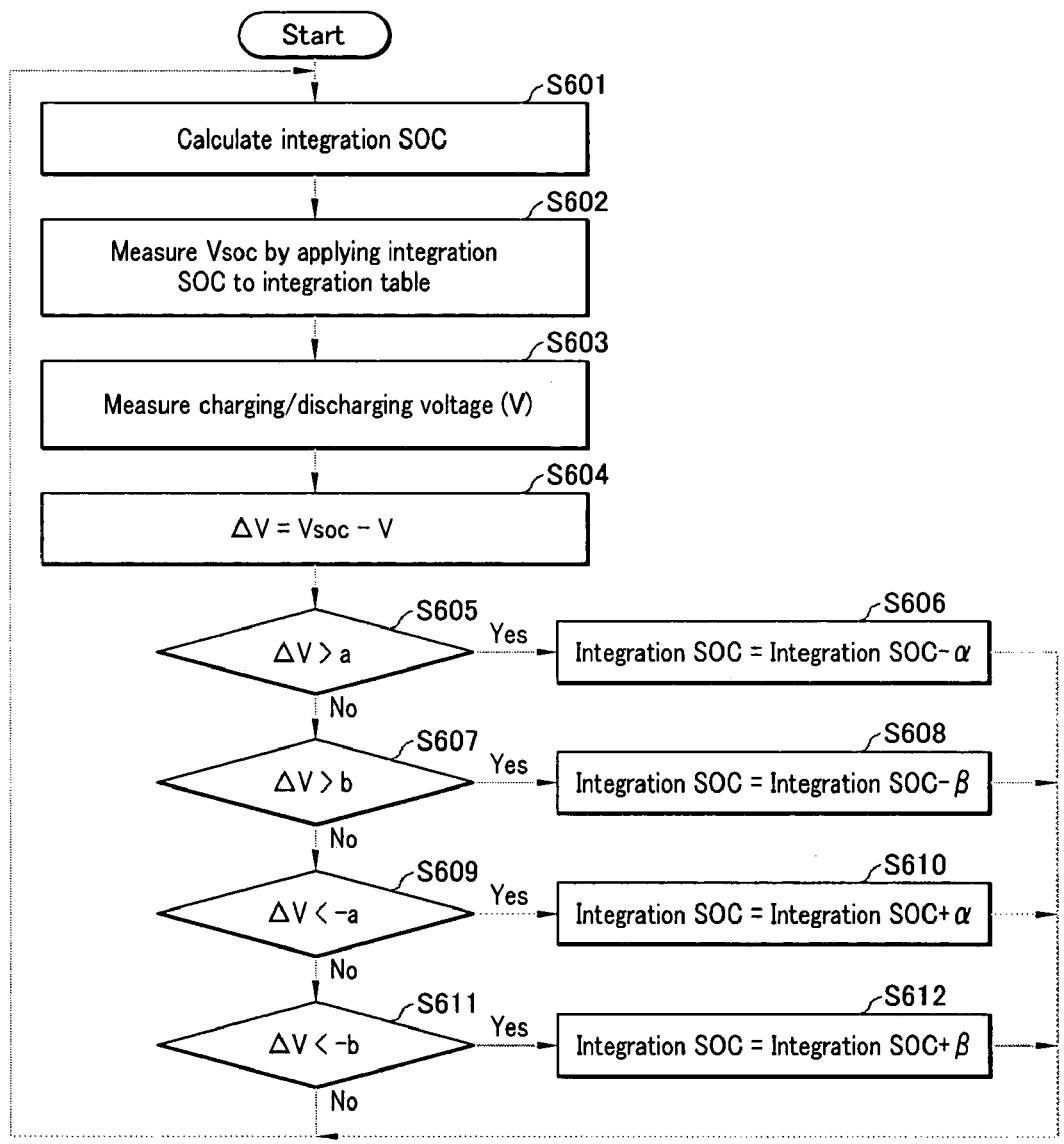
FIG. 6 is a flowchart that sequentially illustrates a method for correcting SOC of a battery according to another exemplary embodiment of the present invention.

A detailed description of the SOC compensation method according to the second exemplary embodiment of the present invention will now be provided with reference to FIG. 5 and FIG. 6. FIG. 5 schematically shows an MCU 120 of a BMS according to the second exemplary embodiment of the present invention. The MCU 120 has substantially the same functions as the MCU 20 of FIGS. 1 and 2, and can be used in the BMS 1 of FIG. 1 in place of the MCU 20. The MCU 120 is different from the MCU 20 in that the MCU 120 does not include a Rheobasic voltage calculator 23. An effective range determiner 124 in the MCU 120 receives an input from the sensing unit 10.

As shown in FIG. 5, the MCU 120 of the BMS according to the second exemplary embodiment of the present invention includes an integration SOC calculator 21, an integration voltage calculator 22, the effective range determiner 124, an SOC compensator 25, and an SOC output unit 26.

The integration SOC calculator 21, the integration voltage calculator 22, and the SOC output unit 26 are the same as those in the first exemplary embodiment which has been described with reference to FIG. 2. However, the effective range determiner 124 and the SOC compensator 125 of the second exemplary embodiment have substantially the same functions as the effective range determiner 24 and the SOC compensator 25 in the first exemplary embodiment, but they have different operational processes since they have different operation processing parameters than those of the first exemplary embodiment.

That is, the effective range determiner 124 receives a charge/discharge voltage V of the battery 2 from the sensing unit 10, receives an integration voltage Vsoc from the integration voltage calculator 22, obtains a difference (i.e., an integration error) between the two voltages V and Vsoc, and determines where the calculated integration error is included among multiple effective ranges.

The effective range determiner 124 calculates the integration error ΔVo through Equation 2.

$$\Delta V = V_{SOC} - V \qquad \text{Equation 2}$$

In Equation 2, a positive integration error ΔV is output when the integration voltage Vsoc is greater than the charge/discharge voltage V, and a negative integration error ΔV is output when the integration voltage Vsoc is less than the charge/discharge voltage V.

After receiving an output that corresponds to information on a range of the integration error ΔV within the multiple effective ranges from the effective range determiner 124, the SOC compensator 125 adds or subtracts a compensation SOC to the integration SOC corresponding to the range of the integration error ΔV. Through such a compensation, the integration SOC can be maintained within an SOC range that corresponds to the minimum effective range among the multiple effective ranges.

Here, the SOC that corresponds to an integration voltage Vsoc can be obtained from an SOC to OCV table, and the SOC that corresponds to the charge/discharge voltage V can be obtained from an SOC to charge/discharge voltage table. This implies that the integration voltage Vsoc and the charge/discharge voltage V have different SOCs respectively even though they have the same voltage level because the two voltages V and Vsoc use different SOC tables, respectively.

A compensation SOC according to the second exemplary embodiment of the present invention is set by using an SOC difference according to the SOC table difference.

An SOC compensation method of a battery according to the second exemplary embodiment of the present invention will be described with reference to FIG. 6. FIG. 6 sequentially shows the SOC compensation process of the battery according to the second exemplary embodiment of the present invention. The double effective ranges of FIG. 6 are the same as those of FIG. 4, and therefore reference numerals of FIG. 6 are the same as those of FIG. 4.

The integration SOC calculator 21 integrates a current value received from the sensing unit 10 during a period of time (e.g., a predetermined period of time) and determines an integration current, calculates an integration SOC by using the integration current, and provides the integration SOC to the integration voltage calculator 22 and the SOC compensator 125, in step S601.

After receiving the integration SOC, the integration voltage calculator 22 applies the received integration SOC to the SOC to integration voltage table to determine the integration voltage Vsoc, and provides the integration voltage Vsoc to the effective range determiner 124, in step S602. At the same time, a battery charge/discharge voltage V output from the sensing unit 10 is provided to the effective range determiner 124.

After receiving the integration voltage Vsoc from the integration voltage calculator 22, the effective range determiner 124 determines the charge/discharge voltage V received from the sensing unit 10 at the same time, in step S603.

Then the effective range determiner 124 subtracts the charge/discharge voltage V from the integration voltage Vsoc to obtain an integration error ΔV, in step S604.

In order to compare the integration error ΔV to multiple effective ranges, the effective range determiner 124 determines whether the integration error ΔV is greater than a first maximum threshold value a, in step S605.

When a result of the determination of the step S605 shows that the integration error ΔV is greater than the first maximum threshold value a, the effective range determiner 124 outputs a first positive excess signal to the SOC compensator 125. When the first positive excess signal is output, the SOC compensator 125 subtracts a first positive compensation SOC α from the integration SOC that has been currently received from the SOC calculator 21 (i.e., integration SOC—first positive compensation SOC α) and provides a compensation result SOC to the SOC output unit 26 in step S606. Here, the first positive correction SOC α is set corresponding to the first positive excess signal.

When the result of the determination of the step S605 shows that the integration error ΔV is less than the first maximum threshold value a, the effective range determiner 124 compares the integration error ΔV with a second maximum threshold value b and determines whether the integration error ΔV is greater than the second maximum threshold value b, in step S607.

When a result of the determination of the step S607 shows that the integration error ΔV is greater than the second maximum threshold value b, the effective range determiner 124 outputs a second positive excess signal to the SOC compensator 125. When the second positive excess signal is output, the SOC compensator 125 subtracts a second positive correction SOC β from the integration SOC (i.e., the integration SOC—second positive compensation SOC β), and provides a compensation result SOC to the SOC output unit 26, in step S608. Here, the second positive correction SOC is set corresponding to the second positive excess signal.

When a result of the determination of the step S607 shows that the integration error ΔV is less than the second maximum threshold value b, the effective range determiner 24 compares the integration error ΔV with a first minimum threshold value −a and determines whether the integration error ΔV is less than the first minimum threshold value −a, in step S609.

When a result of the determination of the step S609 shows that the integration error ΔV is less than the first minimum threshold value −a, the effective range determiner 124 outputs a first negative excess signal to the SOC compensator 125. When the first negative excess signal is output, the SOC compensator 125 adds a first negative compensation SOC α to an integration SOC that has been currently received from the integration SOC output unit 21 (i.e., integration SOC+first negative compensation SOC α) and provides a compensation result SOC to the SOC output unit 26 in step S610, wherein the first negative correction SOC is set corresponding to the first negative excess signal.

When the integration error ΔV is greater than the first minimum threshold value −a as a result of the determination in the step S609, the effective range determiner 124 compares the integration error ΔV to the second minimum threshold value −b and determines whether the integration error ΔV is less than the second minimum threshold value −b in step S611.

The effective range determiner 124 outputs a second negative excess signal to the SOC compensator 125 when the determination of the step S611 shows that the integration error ΔV is less than the second minimum threshold value −b. When the second negative excess signal is output, the SOC compensator 125 adds a second negative compensation SOC β to an integration SOC that has been currently received from the integration SOC output unit 21 and provides a compensation result SOC to the SOC output unit 26 in step S612, wherein the second negative compensation SOC β is set corresponding to the second negative excess signal.

In addition, the effective range determiner 124 determines that the integration error ΔV is in the normal state when it is less than the second maximum threshold value b and greater than the second minimum threshold value −b and outputs a normal signal to the SOC compensator 125, and the SOC compensator 125 provides the integration SOC that has been received from the integration SOC calculator 21 to the SOC output unit 26.

It is known that, in general, SOC estimation by using the current integration method increases errors as time passes.

Therefore, in one embodiment, the number of compensation attempts and the compensation errors due to the SOC estimate error (see FIG. 3) that can be estimated through the voltages Vo and V can be reduced by increasing a time interval of compensation (i.e., a compensation correction cycle time) and determining the correction SOC α and β in proportion to absolute values of the integration errors ΔVo and ΔV. This is because the SOC error corresponding to the Vo error may increase even though the Vo error is small in a middle SOC region.

For example, a cumulative error may be increased due to integration as the compensation cycle time according to an exemplary embodiment of the present invention is increased. Therefore, in one embodiment, to compensate the increase of integration error, a lot of threshold values (e.g., a, b, −a, −b) and the corresponding compensation SOC values (e.g., α and β) are set for voltages Vo and V so as to apply the largest SOC compensation value to compensate the largest integration error, thereby reducing the number of compensation performances while resulting in the same compensation effect.

The compensation SOC is a compensation value that compensates an integration SOC to be included within the effective SOC range ΔSOC.

In the present exemplary embodiment, the compensation SOC exemplarily has a predetermined value. However, the compensation SOC may have an arbitrary value corresponding to the sizes of integration errors ΔVo or ΔV.

Herein, the arbitrary compensation SOC A can be represented as given in Equation 3 using a function of the integration errors ΔVo or ΔV.

$$A = K \times \Delta V_0 (\text{or } \Delta V) \times \Delta SOC + \epsilon \qquad \text{Equation 3}$$

Where K denotes a constant number, Δ SOC denotes an SOC predetermined for compensation, and ϵ denotes an SOC constant number.

The above-described exemplary embodiments of the present invention can be realized not only through a method and an apparatus, but also through a software program that can perform functions corresponding to configurations of the exemplary embodiments of the present invention or a recording medium storing the program, and this can be easily realized by a person skilled in the art.

As described above, when estimating an SOC by using integration capacity, an error between a real SOC value and an estimated SOC value may be generated as time passes. The error can be measured through an integration voltage and a rheobasic voltage, and an accurate SOC of the battery can be obtained by compensating the measured amount of errors.

In addition, an effective range is set for the error and thus SOC compensation can be performed without irritating a system process. In addition, multiple effective ranges are provided so that an SOC compensation value can be changed on the basis of a location of the integration error among the multiple effective ranges, thereby acquiring a more accurate SOC of the battery.

While this invention has been described in connection with certain exemplary embodiments, it is to be understood that the invention is not limited to the disclosed embodiments, but, on the contrary, is intended to cover various modifications and equivalent arrangements included within the spirit and scope of the appended claims.

What is claimed is:

1. A state of charge (SOC) compensation method of a battery management system for compensating an SOC of a battery, the SOC compensation method comprising:
    calculating the SOC of the battery and an SOC voltage corresponding to the SOC by using a charge/discharge current of the battery;
    calculating a rheobasic voltage of the battery by using the charge/discharge current of the battery, a voltage of the battery, and an internal resistance of the battery;
    calculating an integration error corresponding to a difference between the SOC voltage and the rheobasic voltage;
    determining in which effective range the integration error is included among multiple effective ranges; and
    adding a compensation SOC corresponding to the effective range in which the integration error is included among the multiple effective ranges to the SOC to make a compensated SOC included in an SOC range that corresponds to a minimum effective range among the multiple effective ranges.

2. The SOC compensation method of claim 1, wherein said determining in which effective range comprises comparing the integration error with at least one of an upper threshold value or a lower threshold value of one or more of the multiple effective ranges, to determine the effective range in which the integration error is included among the multiple effective ranges.

3. The SOC compensation method of claim 2, wherein said adding the compensation SOC comprises increasing the compensation SOC as the effective range in which the integration error is included is increased, and setting the compensation SOC to "0" when the integration error is included within the minimum effective range.

4. The SOC compensation method of claim 2, wherein said adding the compensation SOC comprises subtracting the compensation SOC from the SOC when the integration error exceeds the upper threshold value of another effective range among the multiple effective ranges, which is smaller than the effective range in which the integration error is included and adding the compensation SOC to the SOC when the integration error exceeds the lower threshold value of said another effective range.

5. The SOC compensation method of claim 4, wherein the upper threshold value has a positive value and the lower threshold value has a negative value, and an absolute value of the upper threshold value of the effective range and an absolute value of the lower threshold value of the effective range are the same.

6. The SOC compensation method of claim 1, wherein said calculating the SOC comprises measuring an integration current by employing a current integration method that uses the charge/discharge current of the battery, calculating the SOC corresponding to the integration current, and calculating the SOC voltage by applying the SOC to an open circuit voltage (OCV) table.

7. The SOC compensation method of claim 1, wherein the compensation SOC is calculated according to the following equation:

$$A = K \times \Delta V_0 \times \Delta SOC = \epsilon$$

where A denotes the compensation SOC, K denotes a constant number, $\Delta SOC$ denotes an SOC set for compensation, $\epsilon$ denotes an SOC constant number, and $\Delta Vo$ denotes the integration error.

8. A driving method for driving a battery management system coupled to an engine control unit (ECU) of a vehicle that uses electrical energy, the driving method comprising;
    measuring a charge/discharge current and a pack voltage of a battery;
    calculating a state of charge (SOC) of the battery and an SOC voltage that corresponds to the SOC by using the charge/discharge current of the battery;
    calculating a rheobasic voltage of the battery by using the charge/discharge current of the battery, a voltage of the battery, and an internal resistance of the battery;
    calculating an integration error corresponding to a difference between the SOC voltage and the rheobasic voltage;
    determining in which effective range the integration error is included among multiple effective ranges; and
    adding a compensation SOC corresponding to the effective range in which the integration error is included among the multiple effective ranges to the SOC to make a compensated SOC included in an SOC range that corresponds to a minimum effective range among the multiple effective ranges; and
    outputting the compensated SOC as a current SOC of the battery to the ECU.

9. The driving method of claim 8, wherein said determining in which effective range comprises:
    comparing the integration error with at least one of an upper threshold value or a lower threshold value of the minimum effective range among the multiple effective ranges; and
    determining the effective range in which the integration error is included by repeating the comparison between the integration error and at least one of an upper threshold value or a lower threshold value of a next smallest effective range among the multiple effective ranges when the integration error exceeds the upper threshold value or the lower threshold value of the minimum effective range among the multiple effective ranges.

10. The driving method of claim 9, wherein said adding the compensation SOC comprises increasing the compensation SOC as the effective range in which the integration error is included is increased, and setting the compensation SOC to "0" when the integration error is included in the minimum effective range.

11. The driving method of claim 9, wherein said adding the compensation SOC comprises subtracting the compensation SOC from the SOC when the integration error exceeds an upper threshold value of a specific effective range among the multiple effective ranges, and adding the compensation SOC to the SOC when the integration error exceeds a lower threshold value of the specific effective range.

12. The driving method of claim 11, wherein the upper threshold value has a positive value and the lower threshold value has a negative value, and an absolute value of the upper threshold value and an absolute value of the lower threshold value are the same.

13. The driving method of claim 8, wherein said calculating the SOC comprises measuring an integration current by employing a current integration method that uses the charge/discharge current of the battery, calculating the SOC corresponding to the integration current, and calculating the SOC voltage by applying the SOC to an open circuit voltage (OCV) table.

14. The driving method of claim 13, wherein the compensation SOC is calculated according to the following equation:

$$A = K \times \Delta V_o \times \Delta SOC + \epsilon$$

where A denotes the compensation SOC, K denotes a constant number, $\Delta SOC$ denotes an SOC set for compensation, $\epsilon$ denotes an SOC constant number, and $\Delta Vo$ denotes the integration error.

15. A battery management system for managing a battery, the battery management system being adapted to output a state of charge (SOC) of the battery to an engine control unit (ECU) of a vehicle that uses electrical energy, the battery management system comprising:
   an integration SOC calculator for calculating the SOC by using a charge/discharge current of the battery;
   an integration voltage calculator for calculating an integration voltage that corresponds to the SOC;
   a rheobasic voltage calculator for calculating a rheobasic voltage of the battery by using a pack voltage of the battery, the charge/discharge current of the battery, and an internal resistance of the battery;
   an effective range determiner for calculating an integration error by using the integration voltage and the rheobasic voltage, determining in which effective range the integration error is included among multiple effective ranges, and outputting a specific effective range excess signal or a specific effective range below signal according to a result of the determination;
   an SOC compensator for compensating the integration error to be included within a minimum effective range among the multiple effective ranges by adding a compensation SOC to the SOC when the output of the effective range determiner indicates that the integration error is not included in the specific effective range, the compensation SOC being set in accordance with the output of the effective range determiner; and
   an SOC output unit for outputting an output of the SOC compensator as a current SOC of the battery to the ECU.

16. The battery management system of claim 15, wherein the effective range determiner is adapted to compare the integration error and at least one of an upper threshold value or a lower threshold value of the minimum effective range among the multiple effective ranges, and to determine in which effective range the integration error is included by repeating the comparison between the integration error and at least one of an upper threshold value or a lower threshold value of a next smallest effective range among the multiple effective ranges when the integration error exceeds the upper threshold value or the lower threshold value of the minimum effective range among the multiple effective ranges.

17. The battery management system of claim 16, wherein the effective range determiner is adapted to increase the compensation SOC as the effective range in which the integration error is included is increased, and sets the compensation SOC to "0" when the integration error is included in the minimum effective range.

18. The battery management system of claim 17, wherein the upper threshold value has a positive value and the lower threshold value has a negative value, and an absolute value of the upper threshold value and an absolute value of the lower threshold value are the same.

19. The battery management system of claim 18, wherein the SOC compensator is adapted to subtract the compensation SOC from the SOC when the integration error exceeds an upper threshold value of the specific effective range and to add the compensation SOC to the SOC when the integration error exceeds a lower threshold value of the specific effective range.

20. The battery management system of claim 19, wherein the integration voltage calculator is adapted to calculate an integration voltage that corresponds to the SOC by applying the SOC to an SOC to open circuit voltage (OCV) table.

21. The battery management system of claim 15, wherein the compensation SOC can be calculated as given in the following equation:

$$A = K \times \Delta V_o \times \Delta SOC = \epsilon$$

where A denotes the compensation SOC, K denotes a constant number, $\Delta SOC$ denotes an SOC set for compensation, $\epsilon$ denotes an SOC constant number, and $\Delta Vo$ denotes the integration error.

* * * * *

UNITED STATES PATENT AND TRADEMARK OFFICE
CERTIFICATE OF CORRECTION

PATENT NO. : 7,982,433 B2  
APPLICATION NO. : 11/643117  
DATED : July 19, 2011  
INVENTOR(S) : Gye-Jong Lim et al.

Page 1 of 1

It is certified that error appears in the above-identified patent and that said Letters Patent is hereby corrected as shown below:

In the Claims

Column 16, Claim 7, line 15.  Delete " $A=K \times \Delta V_0 \times \Delta SOC = \varepsilon$ "
Insert -- $A=K \times \Delta V_0 \times \Delta SOC + \varepsilon$ --

Column 18, Claim 21, line 43.  Delete " $A=K \times \Delta V_0 \times \Delta SOC = \varepsilon$ "
Insert -- $A=K \times \Delta V_0 \times \Delta SOC + \varepsilon$ --

Signed and Sealed this
Twenty-fifth Day of September, 2012

David J. Kappos
*Director of the United States Patent and Trademark Office*